(12) United States Patent
Tian

(10) Patent No.: US 12,431,213 B2
(45) Date of Patent: Sep. 30, 2025

(54) CIRCUIT FOR CALIBRATION CONTROL, ELECTRONIC DEVICE AND METHOD FOR CALIBRATION CONTROL

(71) Applicant: CHANGXIN MEMORY TECHNOLOGIES, INC., Hefei (CN)

(72) Inventor: Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 143 days.

(21) Appl. No.: 18/448,340

(22) Filed: Aug. 11, 2023

(65) Prior Publication Data

US 2023/0386599 A1 Nov. 30, 2023

Related U.S. Application Data

(63) Continuation of application No. PCT/CN2022/099557, filed on Jun. 17, 2022.

(30) Foreign Application Priority Data

Apr. 29, 2022 (CN) .......................... 202210475861.X

(51) Int. Cl.
*G11C 29/50* (2006.01)
*G11C 7/22* (2006.01)

(52) U.S. Cl.
CPC .......... *G11C 29/50008* (2013.01); *G11C 7/22* (2013.01); *G11C 2207/2254* (2013.01)

(58) Field of Classification Search
CPC ... G11C 29/50008; G11C 29/028; G11C 7/22; G11C 7/1057; G11C 7/1084; G11C 7/04;
(Continued)

(56) References Cited

U.S. PATENT DOCUMENTS 9,935,632 B1 4/2018 Gans
10,090,836 B1 10/2018 Gans
(Continued)

FOREIGN PATENT DOCUMENTS

CN 101686051 A 3/2010
CN 106486155 A 3/2017
(Continued)

OTHER PUBLICATIONS

International Search Report in the international application No. PCT/CN2022/099557, mailed on Dec. 19, 2022. 4 Pages.

*Primary Examiner* — Sultana Begum
(74) *Attorney, Agent, or Firm* — SYNCODA LLC; Feng Ma

(57) ABSTRACT

A circuit for calibration control includes an off-chip calibration circuit and a mode switching circuit, and the off-chip calibration circuit includes a preprocessing circuit and a mapping circuit. The preprocessing circuit is configured to receive a current set of environmental parameters, decode the current set of environmental parameters and output parameter decoding signals. The mapping circuit is configured to receive the parameter decoding signals and output a first calibration code according to the parameter decoding signals. The mode switching circuit is configured to receive a calibration mode signal and the first calibration code, and determine the first calibration code as a ZQ calibration code in a case where the calibration mode signal indicates an off-chip calibration mode.

11 Claims, 4 Drawing Sheets

(58) Field of Classification Search
CPC ........ G11C 2207/2254; G11C 11/4093; G11C 11/406; G11C 11/4072; G11C 11/4074; G11C 11/40626
See application file for complete search history.

(56) References Cited

U.S. PATENT DOCUMENTS

| | | |
|---|---|---|
| 10,439,612 B1 | 10/2019 | Johnson |
| 11,145,383 B1 | 10/2021 | Lee |
| 2009/0080281 A1* | 3/2009 | Hashiba ................. G11C 5/143 327/109 |
| 2010/0077268 A1 | 3/2010 | Lee |
| 2016/0094202 A1* | 3/2016 | Hollis ................. G11C 29/028 327/109 |
| 2017/0062050 A1 | 3/2017 | Baek |
| 2019/0028102 A1 | 1/2019 | Gans |
| 2020/0059232 A1 | 2/2020 | Johnson |
| 2021/0383844 A1 | 12/2021 | Antonyan |
| 2021/0391028 A1 | 12/2021 | Lee |

FOREIGN PATENT DOCUMENTS

| | | |
|---|---|---|
| CN | 112204665 A | 1/2021 |
| CN | 113421598 A | 9/2021 |
| CN | 113539344 A | 10/2021 |

\* cited by examiner

CIRCUIT FOR CALIBRATION CONTROL, ELECTRONIC DEVICE AND METHOD FOR CALIBRATION CONTROL

CROSS-REFERENCE TO RELATED APPLICATIONS

This application is a continuation of International Patent Application No. PCT/CN2022/099557 filed on Jun. 17, 2022, which claims priority to Chinese Patent Application No. 202210475861.X, filed on Apr. 29, 2022. The disclosures of these applications are hereby incorporated by reference in their entireties.

BACKGROUND

An output driver circuit and a termination resistor circuit existing in a Dynamic Random Access Memory (DRAM) are used to realize the signal transmission process. During the operation of DRAM, it is necessary to calibrate the relevant resistance values of the output drive circuit and the termination resistor circuit to match the practical operating conditions (such as voltage and temperature), which is called ZQ calibration. However, ZQ calibration takes up a certain amount of power consumption and system time, which reduces the performance of memory.

SUMMARY OF THE INVENTION

The present disclosure relates to, but is not limited to, a circuit for calibration control, an electronic device, and a method for calibration control.

The technical solutions of the present disclosure are implemented as follows.

In a first aspect, the embodiment of the present disclosure provides a circuit for calibration control applied to a memory. The circuit for calibration control includes an off-chip calibration circuit and a mode switching circuit, and the off-chip calibration circuit includes a preprocessing circuit and a mapping circuit.

The preprocessing circuit is configured to receive a current set of environmental parameters, decode the current set of environmental parameters and output parameter decoding signals.

The mapping circuit is configured to receive the parameter decoding signals and output a first calibration code according to the parameter decoding signals.

The mode switching circuit is configured to receive a calibration mode signal and the first calibration code, and determine the first calibration code as a ZQ calibration code in a case where the calibration mode signal indicates an off-chip calibration mode.

In a second aspect, the embodiment of the present disclosure provides an electronic device including a memory and the memory including a circuit for calibration control as in the first aspect.

In a third aspect, the embodiment of the present disclosure provides a method for calibration control applied for an electronic device including a memory. The method includes the following operations.

A current set of environmental parameters is received. The current set of environmental parameters is decoded to obtain parameter decoding signals. A first calibration code is determined according to the parameter decoding signals. A calibration mode signal is received. The first calibration code is determined as a ZQ calibration code in the case where the calibration mode signal indicates an off-chip calibration mode.

DETAILED DESCRIPTION

Figure 1:
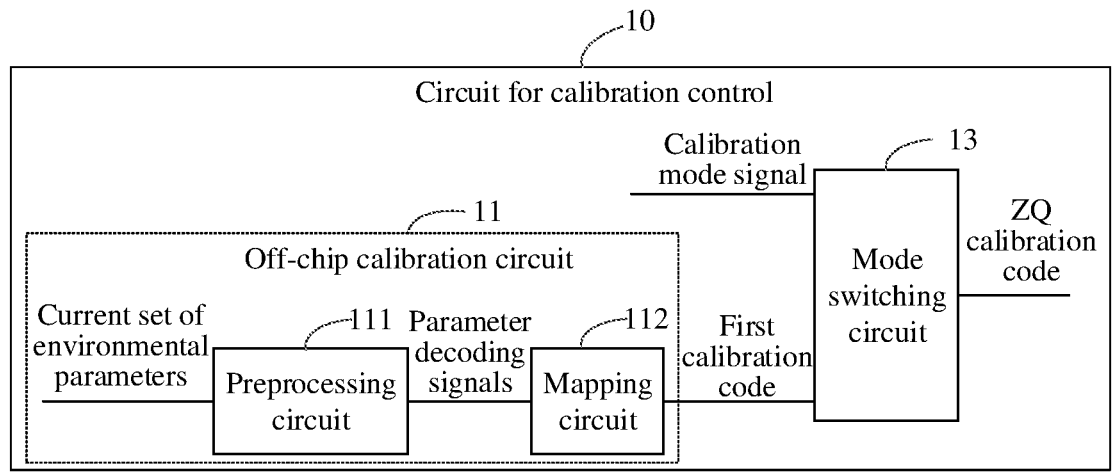
FIG. 1 is a structural diagram of a circuit for calibration control according to an embodiment of the present disclosure.

The technical solutions in the embodiments of the present disclosure will be clearly and completely described below in conjunction with the drawings in the embodiments of the present disclosure. It should be understood that the specific embodiments described herein are intended only to explain the relevant application and not to limit the application. In addition, it should be noted that for ease of description only portions related to the application are illustrated in the drawings.

Unless otherwise defined, all technical and scientific terms used herein have the same meanings as are commonly understood by those skilled in the art of the present disclosure. The terms used herein are for the purpose of describing embodiments of the present disclosure only and are not intended to limit the present disclosure.

In the following description, reference is made to "some embodiments" that describe a subset of all possible embodiments, but it is understood that "some embodiments" may be the same subset or different subsets of all possible embodiments and may be combined with each other without conflict.

It should be noted that the term "first\second \third" referred to in the embodiments of the present disclosure is used only to distinguish similar objects and does not represent a particular ordering of objects, and it should be understood that the "first\second\third" may be interchanged in a particular order or priority order where permissible to enable the embodiments of the present disclosure described herein to be implemented in an order other than that illustrated or described herein.

Explanations of the technical terms involved in the embodiments of the present disclosure and the correspondences of some terms are as follows:

Low Power Double Data Rate SDRAM (LPDDR);

Joint Electron Device Engineering Council (JEDEC).

With the development of technology, the data processing frequency of memory (such as LPDDR) is getting higher and higher, so it is very important to maintain signal integrity during data transmission. For example, LPDDR has ZQ pin (BALL), which is externally connected to a standard resistor of 240 ohms, and configured to calibrate the output impedance of data signal DQ and the terminal impedance of command address signal CA, so as to realize impedance matching during signal transmission. The above impedance calibration process is also called ZQ calibration.

At present, during the operation of LPDDR, ZQ self-calibration processing needs to be performed frequently according to the external conditions of the memory. However, if the external conditions, such as voltage and temperature, are constant, the ZQ calibration code obtained after each ZQ calibration for the same chip is roughly the same, or the lowest bit of the ZQ calibration code will change slightly due to noise, but it is also within the error range. However, each ZQ self-calibration processing causes a certain amount of power consumption and takes up a certain amount of calibration time, resulting in a resource waste of the memory. In addition, if the voltage noise of the system is relatively large, the ZQ calibration code may be affected by the voltage noise and introduced a large deviation, and accordingly, the signal integrity of the memory will be degraded due to impedance mismatch.

Based on this, the embodiment of the present disclosure provides a circuit for calibration control, which quickly and reasonably determines a first calibration code according to the current set of environmental parameters, and then directly sets a ZQ calibration code in an off-chip calibration mode, thereby not only reducing power consumption but also saving system time.

The embodiments of the present disclosure will be described in detail below with reference to the drawings.

In some embodiments of the present disclosure, a method for calibration control is provided. The method includes the following operations.

In operation S1, a calibration mode signal is received.

In operation S2, in a case where the calibration mode signal indicates the off-chip calibration mode, a first calibration code is directly determined according to the current set of environmental parameters, and the first calibration code is determined as a ZQ calibration code.

In operation S3, in a case where the calibration mode signal indicates the on-chip calibration mode, the memory is controlled to perform ZQ self-calibration processing, a second calibration code adapted to the current set of environmental parameters is obtained, and the second calibration code is determined as the ZQ calibration code.

Here, there is no sequence between the operation S2 and the operation S3.

It should be noted that the method for calibration control according to the embodiment of the present disclosure is applied to a memory, and the memory supports the on-chip calibration mode and the off-chip calibration mode, so that a user can send a calibration mode signal to select a required ZQ calibration mode to match different practical application scenarios.

It should be noted that in the off-chip calibration mode, the first calibration code is directly determined as the ZQ calibration code to implement the impedance calibration for the memory. In the on-chip calibration mode, the second calibration code obtained after ZQ self-calibration processing is used as the ZQ calibration code to implement the impedance calibration for the memory. It should be understood that the ZQ calibration code is subsequently written to the input impedance circuit and the termination resistor circuit to calibrate the output impedance of the data signal DQ and the termination impedance of the command address signal CA to desired values.

In this way, the user is allowed to select the on-chip calibration mode or the off-chip calibration mode to determine the ZQ calibration code, which achieves the best performance in different practical application scenarios. In a case where the external condition is constant, ZQ calibration code can be set directly through off-chip calibration mode without frequent ZQ self-calibration processing, which not only reduces power consumption but also saves system time, thus reducing resource waste and improving data processing performance of memory. In addition, the off-chip calibration mode can also avoid the deviation introduced by environmental noise to ZQ calibration code, and avoid the signal integrity degradation of memory caused by impedance mismatch.

In an embodiment of the present disclosure, referring to FIG. 1, a schematic structural diagram of a circuit for calibration control 10 according to an embodiment of the present disclosure is illustrated. As illustrated in FIG. 1, the circuit for calibration control 10 includes an off-chip calibration circuit 11 and a mode switching circuit 13, and the off-chip calibration circuit 11 includes a preprocessing circuit 111 and a mapping circuit 112.

The preprocessing circuit 111 is configured to receive a current set of environmental parameters, decode the current set of environmental parameters, and output parameter decoding signals.

The mapping circuit 112 is configured to receive the parameter decoding signals and output a first calibration code according to the parameter decoding signals.

The mode switching circuit 13 is configured to receive a calibration mode signal and the first calibration code, and determine the first calibration code as a ZQ calibration code in a case where the calibration mode signal indicates an off-chip calibration mode.

It should be noted that the circuit for calibration control 10 in the embodiment of the present disclosure is applied to various types of memories. For example, the memory may be LPDDR4, LPDDR5, DDR4, DDR5, etc.

In the embodiment of the present disclosure, the off-chip calibration circuit 11 can directly determine the first calibration code corresponding to the current set of environmental parameters according to the current set of environmental parameters of the memory, and there is no need to perform real-time calibration operation on the memory. In the case where the calibration mode signal indicates the off-chip calibration mode, the mode switching circuit 13 uses the first calibration code directly determined by the off-chip calibration circuit 11 as the ZQ calibration code, which can avoid frequent ZQ self-calibration processing, not only reduce power consumption but also save system time, thereby reducing resource waste, improving data processing performance of the memory, avoiding deviation introduced by environmental noise to the ZQ calibration code, and avoiding signal integrity degradation of the memory caused by impedance mismatch.

It should be noted that the current set of environmental parameters indicates the environmental conditions in which the memory is located. Here, there are many possibilities for the source of the current set of environment parameters. For example, the current set of environment parameters is sent by the user or automatically determined by the memory, or a part of the current set of environment parameters is sent by the user and the other part is automatically determined by the memory.

Figure 2:
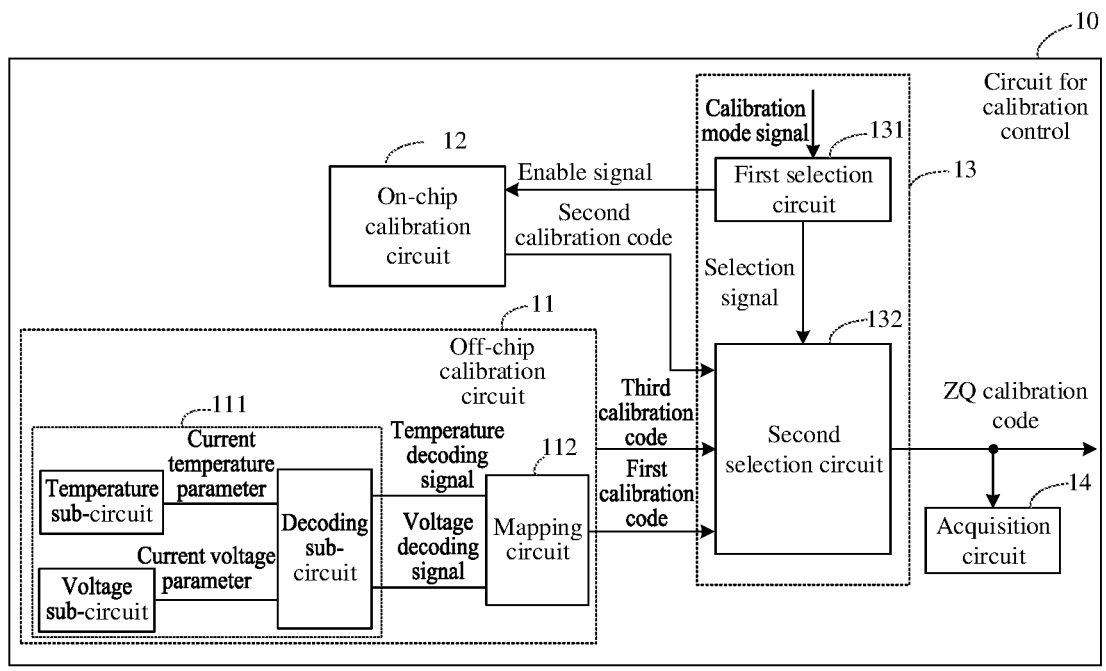
FIG. 2 is a structural diagram of another circuit for calibration control according to an embodiment of the present disclosure.

In some embodiments, as illustrated in FIG. 2, the current set of environmental parameters includes a current temperature parameter and a current voltage parameter, and the parameter decoding signals include a temperature decoding signal and a voltage decoding signal. The preprocessing circuit 111 includes a temperature sub-circuit, a voltage sub-circuit and a decoding sub-circuit.

The temperature sub-circuit is configured to determine the current temperature parameter.

The voltage sub-circuit is configured to determine the current voltage parameter.

The decoding sub-circuit is configured to receive the current voltage parameter and the current temperature parameter, and decode the current temperature parameter and the current voltage parameter to obtain the temperature decoding signal and the voltage decoding signal.

Figure 3:
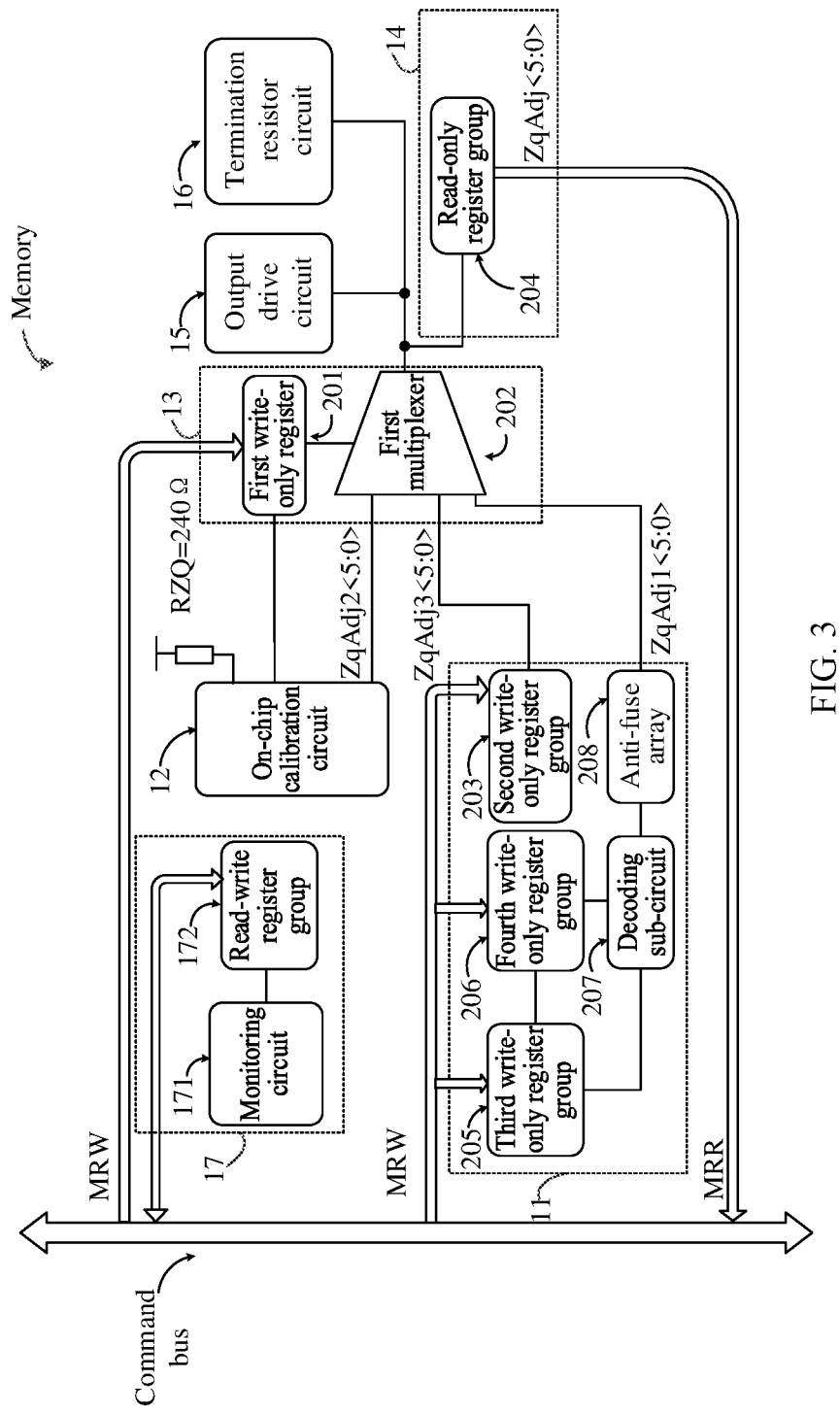
FIG. 3 is a schematic diagram of an application scenario of a circuit for calibration control according to an embodiment of the present disclosure.

In some embodiments, the current temperature parameter and the current voltage parameter are both sent by the user. Referring to FIG. 3, a schematic diagram of an application scenario of a circuit for calibration control 10 according to an embodiment of the present disclosure is illustrated. As illustrated in FIG. 3, the temperature sub-circuit includes a third write-only register group 205 and the voltage sub-circuit includes a fourth write-only register group 206. An input end of the third write-only register group 205 receives the current temperature parameter sent by the user, an input end of the fourth write-only register group 206 receives the current voltage parameter sent by the user, and an output end of the third write-only register group 205 and an output end of the fourth write-only register group 206 are both connected to an input end of the decoding sub-circuit 207.

It should be noted that the third write-only register group 205 and the fourth write-only register group 206 are both connected to a command bus to implement related data transmission. Specifically, the user sends the current temperature parameter to the third write-only register group 205 in the form of a write instruction MRW, and sends the current voltage parameter to the fourth write-only register group 206 in the form of a write instruction MRW. That is, in the process of interaction between the user and the electronic device where the memory is located, the user obtains the current temperature parameter and the current voltage parameter of the memory through other related devices of the electronic device, and then the off-chip calibration circuit 11 directly determines the first calibration code according to the current temperature parameter and the current voltage parameter, thus implementing off-chip calibration.

Figure 4:
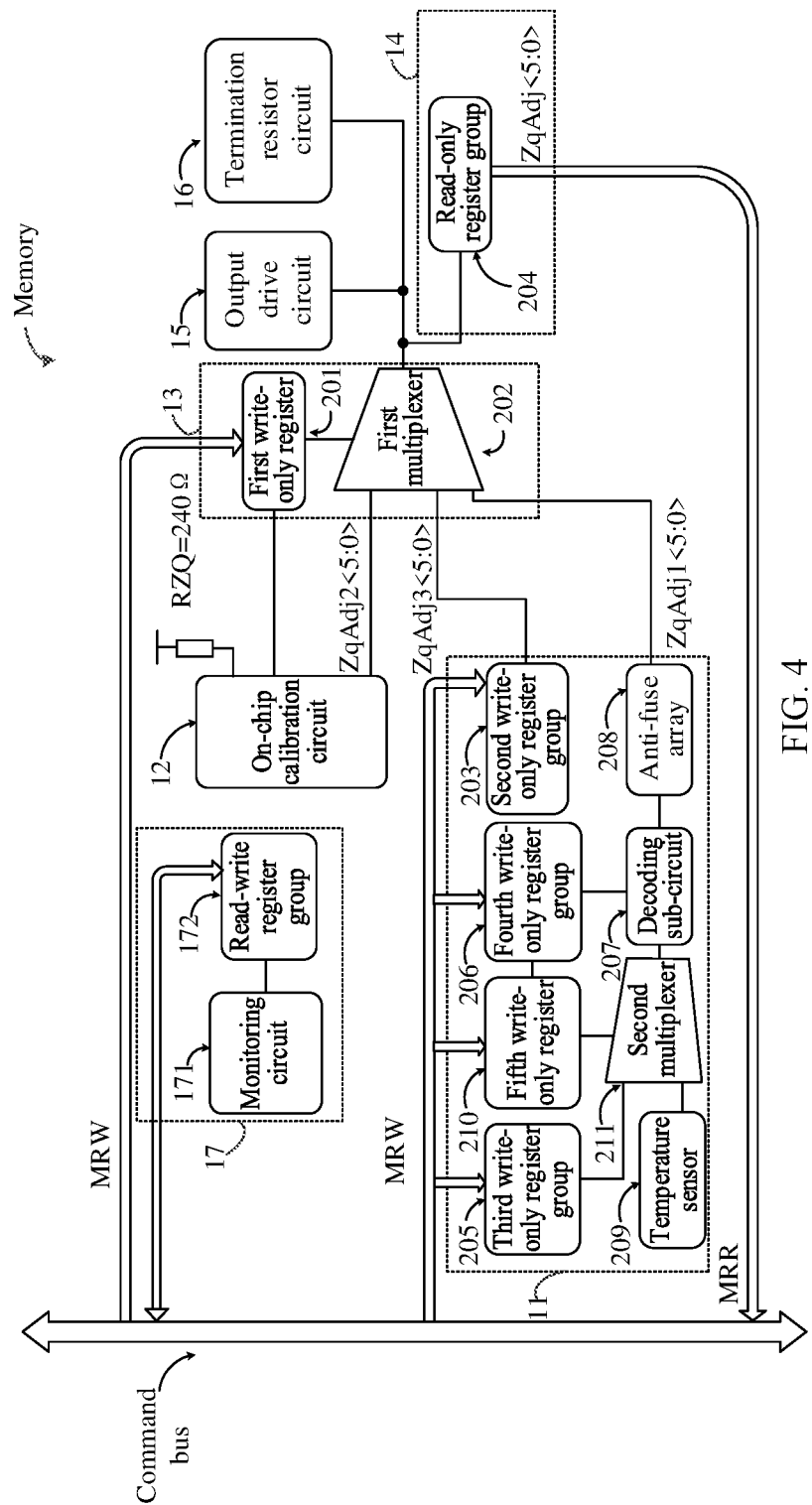
FIG. 4 is a schematic diagram of an application scenario of another circuit for calibration control according to an embodiment of the present disclosure.

In some embodiments, the current temperature parameter is sent by a user or determined by the memory, and the current voltage parameter is sent by the user. Referring to FIG. 4, a schematic diagram of an application scenario of another circuit for calibration control according to an embodiment of the present disclosure is illustrated. As illustrated in FIG. 4, the temperature sub-circuit includes a third write-only register group 205, a temperature sensor 209, a fifth write-only register 210, and a second multiplexer 211, and the voltage sub-circuit includes a fourth write-only register group 206.

The third write-only register group 205 is configured to receive and store a first temperature signal sent by the user.

The temperature sensor 209 is configured to detect a temperature of the memory to obtain a second temperature signal.

The fifth write-only register 210 is configured to receive and store a temperature indication signal.

The second multiplexer 211 is configured to receive the first temperature signal, the second temperature signal and the temperature indication signal, output the first temperature signal as the current temperature parameter in a case where the temperature indication signal instructs to obtain temperature information from off-chip, or output the second temperature signal as the current temperature parameter in a case where the temperature indication signal instructs to obtain the temperature information from on-chip.

The fourth write-only register group 206 is configured to receive and store the current voltage parameter sent by the user.

As illustrated in FIG. 4, input ends of the second multiplexer 211 are respectively connected to an output end of the third write-only register group 205 and an output end of the temperature sensor 209, a control end of the second multiplexer 211 is connected to an output end of the fifth write-only register 210, and an output end of the second multiplexer 211 and an output end of the fourth write-only register group 206 are both connected to an input end of the decoding sub-circuit 207.

It should be noted that the fifth write-only register 210 may store only one bit of data, and the different numerical states (0 or 1) of the data respectively instruct to obtain the temperature information from on-chip or off-chip. The fifth write-only register 210 is also connected to the command bus, and the user writes data to the fifth write-only register 210 in the form of a write instruction MRW. That is, in the process of interaction between the user and the electronic device where the memory is located, the user only needs to acquire the current voltage parameter of the memory through other related devices of the electronic device, and the memory may directly determine the current temperature parameter by using the temperature sensor contained therein. That is, the off-chip calibration circuit 11 directly determines the first calibration code according to the automatically acquired current temperature parameter and the current voltage parameter sent by the user, thereby implementing off-chip calibration, which not only improves the accuracy of the current temperature parameter, but also reduces the operation complexity of the user.

In some embodiments, as can be seen in the combination of FIG. 2 and FIG. 3 or the combination of FIG. 2 and FIG. 4, the mapping circuit 112 may include an anti-fuse array 208, and data stored in the anti-fuse array 208 is obtained by programming based on a relationship between a plurality of sets of environmental parameters and a plurality of candidate calibration codes. An input end of the anti-fuse array 208 is configured to receive the parameter decoding signals, and an output end of the anti-fuse array 208 is configured to output the first calibration code.

It should be noted that, taking a set of environmental parameters including temperature parameter and voltage parameter as an example, in one case, the relationship between the plurality of sets of environmental parameters and the plurality of candidate calibration codes can be expressed as formula (1):

$$\text{First calibration code} = \text{calibration code base value} + \text{voltage coefficient} \times (\text{current voltage parameter} - \text{standard voltage parameter}) + \text{temperature coefficient} \times (\text{current temperature parameter} - \text{standard temperature parameter}) \quad (1)$$

Here, the voltage coefficient denotes a relationship between the first calibration code and the voltage, and more specifically, the voltage coefficient may be a unit change amount of the first calibration code with the change of the voltage parameter. The temperature coefficient denotes a relationship between the first calibration code and the temperature, and more specifically, the temperature coefficient may be a unit change amount of the first calibration code with the change of the temperature parameter.

Here, the calibration code base value denotes a value of the first calibration code in condition of the standard voltage parameter and the standard temperature parameter. The standard voltage parameter and the standard temperature parameter are needed to be selected according to the practical scenario, for example, the standard voltage parameter equals to 0.6 V and the standard temperature parameter equals to 25° C.

In another case, the relationship between a plurality of sets of environmental parameters and a plurality of candidate calibration codes may be expressed in Table 1.

TABLE 1

|  | Voltage parameter = 0.4 V | Voltage parameter = 0.45 V | Voltage parameter = 0.5 V | Voltage parameter = 0.55 V | Voltage parameter = 0.60 V |
| --- | --- | --- | --- | --- | --- |
| Temperature parameter = −40° C. | 001110 | 000110 | 000010 | 000001 | 000000 |
| Temperature parameter = 0° C. | 010100 | 001100 | 001000 | 000101 | 000100 |
| Temperature parameter = 25° C. | 101100 | 100100 | 100000 | 010110 | 010100 |
| Temperature parameter = 85° C. | 110100 | 101100 | 101000 | 100010 | 100000 |
| Temperature parameter = 105° C. | 111100 | 110100 | 110000 | 100100 | 100000 |
| Temperature parameter = 125° C. | 111111 | 111100 | 111000 | 110100 | 100100 |

It should be understood that the various parameters and calibration code values in Table 1 are examples and do not constitute relevant limitations. In addition, the temperature parameter denotes the current temperature of the memory, and the voltage parameter denotes the power supply voltage for the output drive circuit and the termination circuit in the memory. The output drive circuit and the termination circuit may be referred to in the subsequent description.

In some embodiments, as illustrated in FIG. 2, the circuit for calibration control 10 may further include an on-chip calibration circuit 12.

The on-chip calibration circuit 12 is configured to receive an enable signal, and perform ZQ self-calibration processing on the memory to obtain a second calibration code adapted to the current set of environmental parameters in a case where the enable signal is in a valid state.

The mode switching circuit 13 is further configured to receive the second calibration code, and determine the second calibration code as the ZQ calibration code in a case where the calibration mode signal indicates an on-chip calibration mode.

It should be noted that the on-chip calibration circuit 12 is externally connected to a standard resistor, and can perform ZQ self-calibration processing based on the standard resistor, and calibrate the output impedance and the termination impedance of the memory to the standard resistance value. ZQ self-calibration processing denotes the automatic on-chip ZQ calibration in the condition limitation of a certain change of temperature, voltage and time. The specific process can be referred to in the relevant regulations of JEDEC. Here, the resistance value of the standard resistor is 240 ohms (RZQ=240 ohms).

In this way, the user is allowed to select the on-chip calibration mode or the off-chip calibration mode to determine the ZQ calibration code, which achieves the best performance in different practical application scenarios. In a case where the external condition is constant, ZQ calibration code can be set directly through off-chip calibration mode without frequent ZQ self-calibration processing, which not only reduces power consumption but also saves system time, thus reducing resource waste and improving data processing performance of memory. In addition, the off-chip calibration mode can also avoid the deviation introduced by environmental noise to ZQ calibration code, and avoid the signal integrity degradation of memory caused by impedance mismatch.

In some embodiments, the off-chip calibration circuit 11 is further configured to receive and store a third calibration code sent by the user. At most one of the first calibration code and the third calibration code is valid.

The mode switching circuit 13 is further configured to receive the third calibration code, and determine a valid one of the first calibration code and the third calibration code as the ZQ calibration code in a case where the calibration mode signal indicates the off-chip calibration mode.

That is, the user may directly send the third calibration code and determine the determined third calibration code as the ZQ calibration code by using the off-chip calibration mode.

As illustrated in FIG. 2, in some embodiments, the mode switching circuit 13 may include a first selection circuit 131 and a second selection circuit 132.

The first selection circuit 131 is configured to receive the calibration mode signal, output a selection signal in a first state and the enable signal in an invalid state in a case where the calibration mode signal indicates the off-chip calibration mode, or output the selection signal in a second state and the enable signal in a valid state in a case where the calibration mode signal indicates the on-chip calibration mode.

The second selection circuit 132 is configured to receive the selection signal, output the valid one of the first calibration code and the third calibration code as the ZQ calibration code in a case where the selection signal is in the first state, or output the second calibration code as the ZQ calibration code in a case where the selection signal is in the second state.

It should be understood that the first state and the second state represent different logic level states, but their specific values can be determined according to practical application scenarios. For example, the first state may be a high level signal and the second state may be a low level signal. Alternatively, the first state may be a low level signal and the second state may be a high level signal. Similarly, the valid state and the invalid state represent different logic level states, and their specific values can also be determined according to practical application scenarios, which are not limited in the embodiments of the present disclosure.

As illustrated in FIG. 3 or FIG. 4, in some embodiments, the first selection circuit 131 includes a first write-only register 201, the second selection circuit 132 includes a first multiplexer 202, and the off-chip calibration circuit 11 further includes a second write-only register group 203.

The input end of the first write-only register 201 is configured to receive the calibration mode signal, and an input end of the second write-only register group 203 is configured to receive the third calibration code ZqAdj3<5:0>. An enable end of the on-chip calibration circuit 12 is connected to a first output end of the first write-only register 201 to receive the enable signal. A control end of the first multiplexer 202 is connected to a second output end of the first write-only register 201 to receive a selection signal. A first input end of the first multiplexer 202 is connected to an output end of the on-chip calibration circuit 12 to receive the second calibration code ZqAdj2<5:0>. A second input end of the first multiplexer 202 is connected to the output end of the anti-fuse array 208 to receive the first calibration code ZqAdj1<5:0>. A third input end of the first multiplexer 202 is connected to an output end of the second write-only register group 203 to receive a third calibration code ZqAdj3<5:0>. An output end of the first multiplexer 202 is configured to output the ZQ calibration code ZqAdj<5:0>.

It should be noted that, for the first multiplexer 202, in a case where the control signal is in the first state, the second input end and the third input end of the first multiplexer 202 both form a data path with the output end of the first multiplexer 202, so that an valid one of the first calibration code ZqAdj1<5:0> and the third calibration code ZqAdj3<5:0> is output as a ZQ calibration code. Conversely, in a case where the control signal is in the second state, the first input end of the first multiplexer 202 forms a data path with the output end of the first multiplexer 202, so that the second calibration code ZqAdj2<5:0> is output as the ZQ calibration code.

It should be understood that at most one of the first calibration code ZqAdj1<5:0> and the third calibration code ZqAdj3<5:0> is valid, which can avoid data error. Of course, in order to further prevent data error, the first calibration code ZqAdj1<5:0> and the third calibration code ZqAdj3<5:0> may also be input to the third multiplexer (not shown in the drawings), and the third multiplexer is controlled to output the first calibration code ZqAdj1<5:0> or the third calibration code ZqAdj3<5:0> by adjusting the signal at the control end of the third multiplexer, and then the second multiplexer 202 only needs to receive the second calibration code ZqAdj2<5:0> and the output signal of the third multiplexer.

It should be noted that the first write-only register 201 may store only one bit of data, the different numerical states (0 or 1) of the data respectively indicate an on-chip calibration mode or an off-chip calibration mode, and it is depended on the practical application scenario. The second write-only register group 203 needs to store multiple bits of data, which depend on the number of bits of the ZQ calibration code. Exemplarily, the ZQ calibration code may include 6 bits of data, which are represented as <5:0>.

In addition, the input end of the first write-only register 201 and the input end of the second write-only register group 203 are both connected to the command bus, thereby implementing related data transmission. Specifically, the user sends a calibration mode signal to the first write-only register 201 in the form of a write instruction MRW to enable the on-chip calibration mode or an off-chip calibration mode. The anti-fuse array 208 directly determines the first calibration code according to the current set of environmental parameters, or the user sends the third calibration code to the second write-only register group 203 in the form of a write instruction MRW, and sets the ZQ calibration code by using the first calibration code or the third calibration code in the off-chip calibration mode.

It should be understood that before switching from the on-chip calibration mode to the off-chip calibration mode, a first calibration code or a third calibration code should be firstly determined to avoid a blank interval of the ZQ calibration code after the on-chip calibration mode is switched to the off-chip calibration mode. That is, if the on-chip calibration mode is directly switched to the off-chip calibration mode without first determining the first calibration code or the third calibration code, neither the second write-only register group 203 nor the anti-fuse array 208 can output the appropriate calibration code at this time, thereby resulting in a signal error due to the impedance mismatch of the memory.

It should be noted that the circuit structure illustrated in FIG. 3 is not the only choice due to the diversity of circuit elements. Exemplarily, the first write-only register 201 may have only one output end. If the invalid state of the enable signal is the same as the first state of the calibration mode signal, the input end of the first write-only register 201 and the enable end of the on-chip calibration circuit 12 both may be connected to the unique output end of the first write-only register 201. If the invalid state of the enable signal is different from the first state of the calibration mode signal, the associated logic may be implemented by means of an inverter.

In some embodiments, as illustrated in FIG. 2, the circuit for calibration control 10 may further include an acquisition circuit 14. An input end of the acquisition circuit 14 is connected to an output end of the mode switching circuit 13.

The on-chip calibration circuit 12 is further configured to perform the ZQ self-calibration processing for a plurality of times on the memory for a plurality of sets of environmental parameters in a first test mode, to obtain a plurality of candidate calibration codes. Each of the plurality of candidate calibration codes corresponds to a respective one of the plurality of sets of environmental parameters and a respective execution of the ZQ self-calibration processing.

The mode switching circuit 13 is further configured to receive the calibration mode signal indicating the on-chip calibration mode in the first test mode, to output the plurality of candidate calibration codes.

The acquisition circuit 14 is configured to acquire the plurality of candidate calibration codes to establish the relationship between the plurality of sets of environmental parameters and the plurality of candidate calibration codes.

It should be noted that the embodiment of the present disclosure implements the output of the result of the ZQ self-calibration processing through the acquisition circuit 14, so as to obtain the relationship between a plurality of sets of environmental parameters and a plurality of candidate calibration codes. Specifically, in the first test mode, the calibration mode signal fixedly indicates the on-chip calibration mode, and the candidate calibration codes respectively corresponding to a plurality of sets of environmental parameters are obtained by performing self-calibration processing on the memory for a plurality of sets of environmental parameters.

In a case where each set of environmental parameters includes a voltage parameter and a temperature parameter, taking the system composed of memory and memory controller as an example, the first test mode may be entered in a fixed stage of system initialization, the temperature and voltage of the memory may be adjusted by the memory controller, and then the memory is controlled to perform the ZQ self-calibration processing, and the calibration result is output through the acquisition circuit 14 to obtain candidate calibration codes corresponding to the set of environmental parameters (temperature parameter and voltage parameter). Repeating the above process at different temperatures and voltages, candidate calibration codes corresponding to different sets of environmental parameters can be obtained, and the preset mapping relationship is established. In addition, the system may also include a temperature control device. After entering the first test mode, the voltage of the memory is adjusted by the memory controller, and the temperature of the memory is adjusted by other test devices.

In some embodiments, as can be seen according to FIG. 2, FIG. 3 and FIG. 4, the acquisition circuit 14 includes a read-only register group 204, and an input end of the read-only register group 204 is connected to the output end of the first multiplexer 202.

The read-only register group 204 is configured to acquire an output signal of the first multiplexer 202.

The read-only register group 204 is further configured to receive a read instruction after the on-chip calibration circuit 12 performs the ZQ self-calibration processing for one time in the first test mode, and output, according to the read instruction, a respective one of the plurality of candidate calibration codes.

It should be noted that the read-only register group 204 needs to store multiple bits of data, which depend on the number of bits of the ZQ calibration code. That is, the second write-only register group 203 and the read-only register group 204 store the same number of bits of data. In addition, the input end of the read-only register group 204 and the output end of the read-only register group 204 are connected to the command bus. After the read-only register group 204 receives the read instruction MRR from the command bus, the candidate calibration code is outputted.

Thus, the calibration result of the on-chip calibration circuit 12 may be outputted by means of the read-only register group 204, thereby establishing a relationship between a plurality of sets of environmental parameters and a plurality of candidate calibration codes.

In some embodiments, as illustrated in FIG. 3 or FIG. 4, the memory further includes an output drive circuit 15 and a termination resistor circuit 16. The memory is further configured to write the ZQ calibration code into the output drive circuit 15 and the termination resistor circuit 16, to implement resistance calibration processing for the output drive circuit and the termination resistor circuit 16.

In this way, in the embodiment of the present disclosure, the user is allowed to determine the ZQ calibration code through the on-chip calibration mode or the off-chip calibration mode, which can reduce power consumption and save system time.

In the above methods, in the off-chip calibration mode, the user may send the current set of environmental parameters to determine the first calibration code, or the user may directly send the third calibration code, thereby implementing the setting of the ZQ calibration code. In particular, the embodiments of the present disclosure may further provide other means to assist the user in determining the third calibration code to ensure the accuracy of the ZQ calibration.

For example, for the memory, a mapping relationship between a plurality of candidate calibration codes and a plurality of sets of environmental parameters is established in advance, and a user may directly select a third calibration code from a plurality of candidate calibration codes according to the current set of environmental parameters. For another example, as illustrated in FIG. 3 or FIG. 4, the circuit for calibration control 10 further includes a process circuit 17. A process corner parameter of the memory is read out through the process circuit 17, and then a user may determine a third calibration code according to the current set of environmental parameters and the process corner parameter.

Specifically, in some embodiments, the process circuit 17 is configured to perform a process corner test on the memory in a second test mode to obtain a test result signal, and the test result signal is used to determine a process corner parameter. Here, the process corner parameter may be used to measure the effective operating conditions of the memory, and the memories produced in different batches have slight differences. For example, the process corner parameter may respectively represent the typical process corner (TT corner), slow process corner (SS corner), fast process corner (FF corner) and so on. The user may quickly and accurately determine the third calibration code based on the process corner parameter of the memory and the current set of environment parameters of the memory.

It should be noted that as may be seen in FIG. 3 or FIG. 4, the process circuit 17 may include a monitoring circuit 171 and a read-write register group 172. The read-write register group 172 is configured to receive a write instruction including a turn-on time and a turn-off time, and store the turn-on time and the turn-off time in the second test mode. The monitoring circuit 171 is configured to perform a process corner test on the memory based on the turn-on time and the turn-off time in a second test mode to obtain a test result signal. A read-write register group 172 is further configured to acquire and store the test result signal, and output the test result signal in a case where the first read instruction is received.

It should be noted that the monitoring circuit 171 is configured to perform the process corner test on the memory at a predetermined temperature, a predetermined voltage and a predetermined time interval. The essence of the monitoring circuit 171 may be a Ring Oscillator. The read-write register group 172 is configured to receive test related parameters, such as the turn-on time of the Ring Oscillator and the turn-off time of the Ring Oscillator, and acquire and output test result signal (such as the count of the Ring Oscillator, that is, the test result signal). Subsequently, the process corner parameter may be obtained by analyzing the test result signal, and the specific analysis process may be performed automatically or manually.

In some embodiments, a process corner parameter is used to determine a target set of coefficient values among a plurality of preset sets of coefficient values. Each set of the preset sets of coefficient values indicates the relationship between the third calibration code and the set of environmental parameters, and different preset sets of coefficient values correspond to different process corner parameters. During the operation of the memory, the user calculates the third calibration code based on the target set of coefficient values, the current set of environment parameters and the calibration code base value, and the calibration code base value denotes the value of the third calibration code in condition of the standard set of environment parameters. Here, the preset set of coefficient values may be provided to the user by the electronic device where the memory is located, or stored by the user himself.

Exemplarily, both each set of environment parameters and each preset set of coefficient values include a plurality of sub-parameters. For example, each set of environmental parameters includes a voltage parameter and a temperature parameter, and accordingly, the target set of coefficient values includes a voltage coefficient and a temperature coefficient. At this time, the user may calculate the third calibration code with reference to the above formula (1).

In other embodiments, the process corner parameter is used to select a target parameter table from a plurality of preset parameter tables. The preset parameter table indicates the mapping relationship between different sets of environmental parameters and different values of the third calibration code, and the different preset parameter tables correspond to different process corner parameters. During the operation of the memory, the user uses the target parameter table to determine the third calibration code corresponding to the current set of environmental parameters. Here, the preset parameter table may be provided to the user by the electronic device where the memory is located, or stored by the user himself, and the preset parameter table may refer to the above Table 1.

In this way, the target parameter table may be directly determined according to the process corner parameter, and then the required third calibration code may be selected from the target parameter table by using the current set of environmental parameters, which saves the calculation process and is convenient for users to use.

In summary, the circuit for calibration control 10 according to the embodiment of the present disclosure mainly includes the following contents.

First, in the embodiment of the present disclosure, two register groups are added, which are the second write-only register group 203 and the read-only register group 204 respectively. The user sends the write instruction MRW to write the third calibration code into the second write-only register group 203, and the user sends the read instruction MRR to read out the ZQ self-calibration result from the read-only register group 204.

Secondly, the first write-only register 201 (it may also be a programmable fuse (Efuse) register, which is fixed before the memory leaves the factory) is added. The user writes the calibration mode signal into the first write-only register 201 through the write instruction MRW, and controls whether the ZQ calibration code is output by the on-chip calibration circuit 12 or the off-chip calibration circuit 11.

Then, in the embodiment of the present disclosure, the read-write register group 172 is added. The write register part of the read-write register group 172 is configured to receive the turn-on time and the turn-off time sent by the user through the write instruction, thereby controlling the monitoring circuit 171 to perform the process corner test according to the turn-on time and the turn-off time. The read register part of the read-write register group 172 is configured to store a count (test result signal) of the monitoring circuit 171, and the data is read out by the user sending a read instruction MRR. Here, for the monitoring circuit 171, the count obtained in the second test mode (specified voltage, specified temperature, and specified test time interval) may be used for determining the process corner parameter for the user to determine the third calibration code.

Finally, in the embodiment of the present disclosure, the third write-only register group 205 and the fourth write-only register group 206 are added, which are respectively used for storing the current temperature parameter and the current voltage parameter, and the corresponding values are written by the user sending a register write command MRW. The decoding sub-circuit 207 is added, which is configured to decode the current temperature parameter into the temperature decoding signal and the current voltage parameter into a voltage decoding signal. The anti-fuse array Efuse Array is added, and the ZQ calibration codes in condition of different combinations of voltage/temperature are burned in through the anti-fuse array 208. Thus, during the operation of the memory, the corresponding first calibration code may be determined by the anti-fuse array 208 through the temperature decoding signal and the voltage decoding signal output by the decoding sub-circuit 207.

In addition, referring to FIG. 4, in the embodiment of the present disclosure, a second multiplexer 211 may be added. The input ends of the second multiplexer 211 are connected to the third write-only register group 205 and the temperature sensor 209 in the memory, respectively. The output end of the second multiplexer 211 is connected to the input end of the decoding sub-circuit 207. Thus, the user sends a write command MRW to select whether the output value of the temperature sensor 209 (temperature information acquired from the on-chip) or the output value of the third write-only register group 205 (temperature information acquired from the off-chip) is used as the current temperature parameter.

In this way, not only the control circuit for on-chip and off-chip dual selection ZQ calibration is realized, but also the user may quickly and reasonably determine the first calibration code or the third calibration code.

In a specific embodiment, assuming that the set of environmental parameters includes the temperature parameter and the voltage parameter, the operation of the circuit for calibration control 10 illustrated in FIG. 3 is described in detail by taking a system composed of a memory and a memory controller as an example.

First, the manufacturer of the memory may control the memory to enter a first test mode, the combination of temperature and voltage is scanned through the test device, one combination case is scanned each time, and on-chip ZQ self-calibration processing is performed for one time by using the on-chip calibration circuit 12. After the ZQ self-calibration processing is completed, the value of the candidate calibration code is read out by the read-only register group 204, a comparison table (see Table 1 above) of temperatures, voltages and candidate calibration codes is established, and the value of Table 1 is written into the anti-fuse array 208 of the memory.

Secondly, during the operation of the system, the user determines the current voltage parameter through the Power Management Unit (PMU) in the system, and determines the current temperature parameter through the temperature management unit in the system. The user supplies the current voltage parameter and the current temperature parameter to the off-chip calibration circuit 11, and then looks up the table through the anti-fuse array 208 to obtain the first calibration code. After that, the user controls the memory to switch to the off-chip calibration mode by sending a calibration mode signal, and then writes the first calibration code into the driver (output drive circuit 15) of each DQ and CA ODT (termination resistor circuit 16) by using the ZQ Latch command, and further prohibits the on-chip ZQ self-calibration processing, so as to not only achieve the purpose of saving electricity, but also avoid the on-chip ZQ self-calibration deviation caused by environmental noise. In addition, in order to simplify the operation, the current temperature parameter provided by the internal temperature sensor 209 may be directly used by the memory, and the user only needs to provide the current voltage parameter, which may not only set the ZQ calibration value more accurately, but also save program resources for the user.

On the basis of the foregoing, the user may send the third calibration code directly to set the ZQ calibration code.

For example, the third calibration code may be selected from candidate calibration codes based on the current set of environmental parameters of the memory. Specifically, at a certain stage of system initialization, the memory controller controls the memory to enter a first test mode, at which time the calibration mode signal indicates an on-chip calibration mode. The combination of temperature and voltage is scanned by a memory controller, one combination case is scanned each time, and on-chip ZQ self-calibration processing is performed for one time by using the on-chip calibration circuit 12. After the ZQ self-calibration processing is completed, the values of the candidate calibration codes are read out by the read-only register group 204, and the values are recorded by System on Chip (SOC) of the user. After the scanning for all the combinations is completed, the user obtains a comparison table of temperature parameters, voltage parameters and candidate calibration codes, which may also refer to the above Table 1. Thus, a third calibration code may also be selected from the candidate calibration codes after the current voltage parameter and the current temperature parameter are determined during the operation of the system.

As another example, the third calibration code may be calculated based on the current set of environmental parameters and the process corner parameter of the memory. Specifically, at a certain stage of system initialization, the memory controller controls the memory to enter the first test mode, at which time the calibration mode signal indicates the on-chip calibration mode, the memory is controlled to be in the environment of the standard voltage parameter and the standard temperature parameter, and on-chip ZQ self-calibration processing is performed for one time by using the on-chip calibration circuit 12. After the ZQ self-calibration processing is completed, the calibration code base value is read out through the read-only register group 204 and provided to the user. In particular, the user can obtain a plurality of preset sets of coefficient values (including voltage coefficients and temperature coefficients), each preset set of coefficient values corresponds to a respective one of different process corner parameters, and select a target set of coefficient values from a plurality of preset sets of coefficient values according to the process corner of the memory. Thus, based on the current voltage parameter, the current temperature parameter, the calibration code base value and the target set of coefficient values, a third calibration code may be determined by using the following formula: third calibration code=calibration code base value+voltage coefficient×(current voltage parameter−standard voltage parameter)+temperature coefficient×(current temperature parameter−standard temperature parameter).

It should be understood that the voltage coefficient and the temperature coefficient are fitted from a relationship between a plurality of set of environmental parameters and a plurality of candidate calibration codes. That is, assuming that there are a plurality of memories, the process corner parameters of the plurality of memories are represented as process corner parameter 1, process corner parameter 2 . . . process corner parameter n, respectively. For the memory with the process corner parameter 1, the memory is controlled to enter the first test mode according to the preceding operations to perform the ZQ self-calibration processing for a plurality of times, to obtain a plurality of sets of environmental parameters and a plurality of candidate calibration codes. A preset set of coefficient values is obtained by fitting the plurality of set of environmental parameters and a plurality of candidate calibration codes, that is, a preset set of coefficient values corresponding to the process corner parameter 1 is obtained. The preset sets of coefficient values corresponding to the process corner parameter 2 . . . the process corner parameter n are obtained respectively by repeating the above operations for the memory with the process corner parameter 2 . . . the memory with the process corner parameter n, so that the preset sets of coefficient values corresponding to different process corner parameters may be used to select the target set of coefficient values from a plurality of preset sets of coefficient values according to the process corner of the memory.

In contrast, when determining the third calibration code by using process corner parameter, the ZQ calibration processing only need to be performed for one time for the standard set of environmental parameters during system initialization, and executions of the ZQ calibration processing for different sets of environmental parameters are not needed, thereby saving a lot of time and resources. When the first calibration code is determined by using the current set of environmental parameters, the execution of the ZQ calibration processing is not needed during system initialization, thereby further saving the time for ZQ self-calibration during system power-on initialization process.

The embodiment of the disclosure provides a circuit for calibration control, which can quickly and reasonably determine a first calibration code according to current set of environmental parameters, and then directly set a ZQ calibration code in an off-chip calibration mode, thereby not only reducing power consumption but also saving system time.

Figure 5:
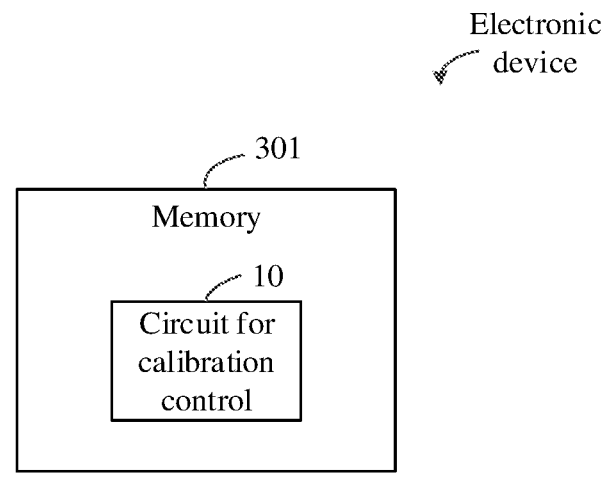
FIG. 5 is a schematic structural diagram of an electronic device according to an embodiment of the present disclosure.

In another embodiment of the present disclosure, FIG. 5 illustrates a schematic structural diagram of an electronic device according to an embodiment of the present disclosure. As illustrated in FIG. 5 the electronic device includes a memory 301 and the memory 301 includes the above circuit for calibration control 10.

Since there is a circuit for calibration control 10 in the electronic device, the first calibration code can be quickly and reasonably determined according to the current set of environmental parameters, and then the ZQ calibration code can be directly set in the off-chip calibration mode, which not only reduces power consumption but also saves system time.

Figure 6:
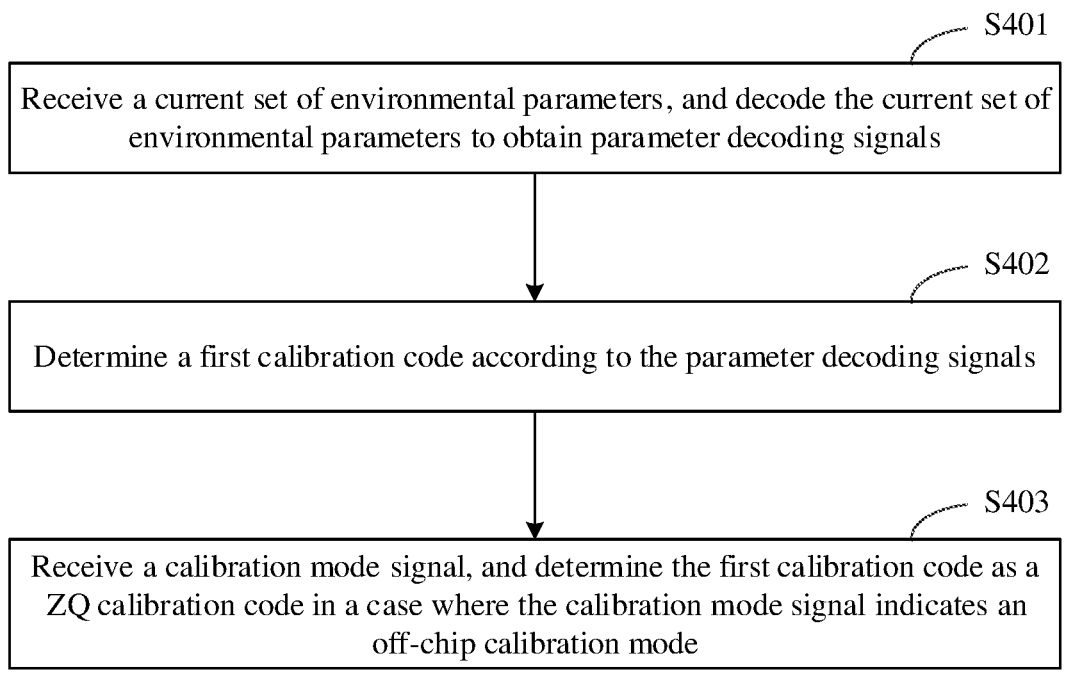
FIG. 6 is a flowchart of a method for calibration control according to an embodiment of the present disclosure.

In yet another embodiment of the present disclosure, FIG. 6 illustrates a flow diagram of a method for calibration control according to the embodiment of the present disclosure. As illustrated in FIG. 6, the method may include the following operations.

In operation S401, current set of environment parameters are received, and the current set of environmental parameters is decoded to obtain parameter decoding signals.

In operation S402, a first calibration code is determined according to the parameter decoding signals.

In operation S403, a calibration mode signal is received, and the first calibration code is determined as a ZQ calibration code in a case where the calibration mode signal indicates an off-chip calibration mode.

It should be noted that the method for calibration control according to the embodiment of the present disclosure is applied to the above electronic device including the memory 301, and the memory 301 includes at least the circuit for calibration control 10. Here, according to the above contents, the memory 301 supports at least the on-chip calibration mode and the off-chip calibration mode.

Here, the operation S401 and the operation S402 may still be repeated after the operation S403. In other words, after the operation S403, the user may still continue to send the latest current set of environmental parameters to the electronic device to update the first calibration code.

In this way, the first calibration code can be quickly and reasonably determined according to the current set of environment parameters of the memory, and then the ZQ calibration code can be directly set by means of the off-chip calibration mode, thus reducing power consumption and saving system time.

It should be noted that the current set of environmental parameters indicates the environmental condition in which the memory is located. Exemplarily, the current set of environmental parameters may include a current temperature parameter and a current voltage parameter. Here, the current temperature parameter is sent by the user or determined by the memory, and the current voltage parameter is sent by the user.

In some embodiments, the memory includes an anti-fuse array, and data stored in the anti-fuse array is obtained by programming based on a relationship between a plurality of sets of environmental parameters and a plurality of candidate calibration codes. The operation of determining the first calibration code according to the parameter decoding signals includes the following operation.

The parameter decoding signals are input to the anti-fuse array to obtain the first calibration code output by the anti-fuse array.

It should be noted that the relationship between a plurality of sets of environmental parameters and a plurality of candidate calibration codes may be expressed in various forms, such as the above formula (1) or Table 1.

In some embodiments, the method further includes controlling the memory to perform ZQ self-calibration processing in response to the calibration mode signal indicates the on-chip calibration mode, to obtain a second calibration code, and determining the second calibration code as the ZQ calibration code.

In this way, in the off-chip calibration mode, the first calibration code may be directly determined according to the current set of environmental parameters, and the first calibration code can be used as the ZQ calibration code to implement the impedance calibration for the memory. In the on-chip calibration mode, the second calibration code obtained after ZQ self-calibration processing is used as the ZQ calibration code to implement the impedance calibration for the memory.

In some embodiments, the method further includes the following operations. In a first test mode, the calibration mode signal is controlled to indicate the on-chip calibration mode. The ZQ self-calibration processing is performed for a plurality of times on the memory for a plurality of sets of environmental parameters to obtain a plurality of candidate calibration codes, to establish a relationship between the plurality of sets of environmental parameters and the plurality of candidate calibration codes. Each of the plurality of candidate calibration codes corresponds to a respective one of the plurality of sets of environmental parameters and a respective execution of the ZQ self-calibration processing.

Here, the relationship between the plurality of sets of environmental parameters and the plurality of candidate calibration codes is used for programming of the anti-fuse array.

In some embodiments, the method further includes the following operations. A third calibration code sent by a user is received. At most one of the first calibration code and the third calibration code is valid. A valid one of the first calibration code and the third calibration code is determined as the ZQ calibration code in the case where the calibration mode signal indicates the off-chip calibration mode.

Thus, in the off-chip calibration mode, the user may directly send the third calibration code, thereby using the third calibration code sent by the user as the ZQ calibration code to implement the impedance calibration for the memory.

It should be noted that, in one case, the third calibration code may be selected by the user from a plurality of candidate calibration codes according to the current set of environmental parameters.

In another case, the third calibration code may be determined by the user based on current set of environmental parameters and process corner parameter. Exemplarily, a user may obtain a plurality of preset sets of coefficient values corresponding to different process corner parameters. During the operation of the memory, the user selects the target set of coefficient values from a plurality of preset sets of coefficient values according to the process corner parameter, so that the third calibration code may be calculated according to the calibration code base value, the target set of coefficient values and the current set of environment parameters. Alternatively, the user may obtain preset parameter tables in condition of different process corners. During the operation of the memory, the user selects the target parameter table from a plurality of preset parameter tables according to the process corner parameter, so that the user directly determines the third calibration code according to the target parameter table. For the target parameter table, the reference is made to the above Table 1.

Here, a plurality of preset sets of coefficient values corresponding to different process corner parameters/a plurality of preset parameter tables corresponding to different process corner parameters may be stored by user himself or provided by the manufacturer.

It should be noted that the first calibration code (or the third calibration code) should be firstly determined before switching from the on-chip calibration mode to the off-chip calibration mode, so as to avoid impedance mismatch caused by the absence of the first calibration code (and the third calibration code) or the inappropriateness of the first calibration code (and the third calibration code) after switching from the on-chip calibration mode to the off-chip calibration mode. In addition, when the memory has been in the off-chip calibration mode, a new first calibration code or a new third calibration code can still be determined to update the ZQ calibration code.

In some embodiments, the method may further include the following operation. Resistance calibration processing is performed on the output drive circuit in the memory and the termination resistor circuit in the memory based on the ZQ calibration code.

The embodiment of the disclosure provides a method for calibration control, which quickly and reasonably determines a first calibration code according to current set of environmental parameters, and then directly sets a ZQ calibration code in an off-chip calibration mode, thereby not only reducing power consumption but also saving system time.

The above is only a preferred embodiment of the present disclosure and is not intended to limit the scope of protection of the present disclosure. It should be noted that, in the present disclosure, the terms "including", "comprising" or any other variation thereof are intended to encompass non-exclusive inclusion such that a process, method, object, or device including a set of elements includes not only those elements but also other elements not explicitly listed, or also elements inherent to such a process, method, object, or device. In the absence of further limitations, an element defined by the phrase "includes a . . . " does not preclude the existence of another identical element in the process, method, object or device in which it is included. The above serial numbers of the embodiments of the present disclosure are for description only and do not represent the advantages and disadvantages of the embodiments. The methods disclosed in several method embodiments provided in the present disclosure can be arbitrarily combined without conflict to obtain new method embodiments. Features disclosed in several product embodiments provided in the present disclosure can be arbitrarily combined without conflict to obtain new product embodiments. Features disclosed in several method or device embodiments provided in the present disclosure can be arbitrarily combined without conflict to obtain new method or device embodiments. The above is only the specific implementation of the present disclosure, but the scope of protection of the present disclosure is not limited thereto. Any skilled person familiar with the technical field can easily think of changes or substitutions within the technical scope disclosed in the present disclosure, which should be covered within the scope of protection of the present disclosure. Therefore, the scope of protection of the present disclosure shall be subject to the scope of protection of the claims.

INDUSTRIAL PRACTICALITY

The embodiments of the present disclosure provide a circuit for calibration control, an electronic device and a method for calibration control. The circuit for calibration control includes an off-chip calibration circuit and a mode switching circuit, and the off-chip calibration circuit includes a preprocessing circuit and a mapping circuit. The preprocessing circuit is configured to receive a current set of environmental parameters, decode the current set of environmental parameters and output parameter decoding signals. The mapping circuit is configured to receive the parameter decoding signals and output a first calibration code according to the parameter decoding signals. The mode switching circuit is configured to receive a calibration mode signal and the first calibration code, and determine the first calibration code as a ZQ calibration code in a case where the calibration mode signal indicates an off-chip calibration mode. In this way, the first calibration code is quickly and reasonably determined according to the current set of environmental parameters sent by the user, and then the ZQ calibration code is directly set in the off-chip calibration mode, which not only reduces power consumption but also saves system time.

What is claimed is:

1. A circuit for calibration control, applied to a memory, and comprising:
    an off-chip calibration circuit and a mode switching circuit, the off-chip calibration circuit comprising a preprocessing circuit and a mapping circuit, wherein
    the preprocessing circuit is configured to receive a current set of environmental parameters, decode the current set of environmental parameters and output parameter decoding signals;
    the mapping circuit is configured to receive the parameter decoding signals and output a first calibration code according to the parameter decoding signals; and
    the mode switching circuit is configured to receive a calibration mode signal and the first calibration code, and determine the first calibration code as a ZQ calibration code in a case where the calibration mode signal indicates an off-chip calibration mode;
    wherein the current set of environmental parameters comprises a current temperature parameter and a current voltage parameter, the parameter decoding signals comprise a temperature decoding signal and a voltage decoding signal, and the preprocessing circuit comprises a temperature sub-circuit, a voltage sub-circuit and a decoding sub-circuit,
    wherein
    the temperature sub-circuit is configured to determine the current temperature parameter;
    the voltage sub-circuit is configured to determine the current voltage parameter; and
    the decoding sub-circuit is configured to receive the current voltage parameter and the current temperature parameter, and decode the current temperature parameter and the current voltage parameter to obtain the temperature decoding signal and the voltage decoding signal;
    wherein the current temperature parameter and the current voltage parameter are both sent by a user, the temperature sub-circuit comprises a third write-only register group, and the voltage sub-circuit comprises a fourth write-only register group,
    wherein an input end of the third write-only register group is configured to receive the current temperature parameter sent by the user, an input end of the fourth write-only register group is configured to receive the current voltage parameter sent by the user, and an output end of the third write-only register group and an output end of the fourth write-only register group are both connected to an input end of the decoding sub-circuit.

2. A circuit for calibration control, applied to a memory, and comprising:
    an off-chip calibration circuit and a mode switching circuit, the off-chip calibration circuit comprising a preprocessing circuit and a mapping circuit,
    wherein the preprocessing circuit is configured to receive a current set of environmental parameters, decode the current set of environmental parameters and output parameter decoding signals;
    the mapping circuit is configured to receive the parameter decoding signals and output a first calibration code according to the parameter decoding signals; and
    the mode switching circuit is configured to receive a calibration mode signal and the first calibration code, and determine the first calibration code as a ZQ calibration code in a case where the calibration mode signal indicates an off-chip calibration mode;
    wherein the current set of environmental parameters comprises a current temperature parameter and a current voltage parameter, the parameter decoding signals comprise a temperature decoding signal and a voltage decoding signal, and the preprocessing circuit comprises a temperature sub-circuit, a voltage sub-circuit and a decoding sub-circuit,
    wherein
    the temperature sub-circuit is configured to determine the current temperature parameter;
    the voltage sub-circuit is configured to determine the current voltage parameter; and
    the decoding sub-circuit is configured to receive the current voltage parameter and the current temperature parameter, and decode the current temperature parameter and the current voltage parameter to obtain the temperature decoding signal and the voltage decoding signal;

wherein the current temperature parameter is sent by a user or determined by the memory, the current voltage parameter is sent by the user, the temperature sub-circuit comprises a third write-only register group, a temperature sensor, a fifth write-only register and a second multiplexer, and the voltage sub-circuit comprises a fourth write-only register group, wherein the third write-only register group is configured to receive and store a first temperature signal sent by the user;

the temperature sensor is configured to detect a temperature of the memory to obtain a second temperature signal;

the fifth write-only register is configured to receive and store a temperature indication signal;

the second multiplexer is configured to:
  receive the first temperature signal, the second temperature signal and the temperature indication signal; and
  output the first temperature signal as the current temperature parameter in a case where the temperature indication signal instructs to obtain temperature information from off-chip; or output the second temperature signal as the current temperature parameter in a case where the temperature indication signal instructs to obtain the temperature information from on-chip; and the fourth write-only register group is configured to receive and store the current voltage parameter sent by the user,
  wherein input ends of the second multiplexer are respectively connected to an output end of the third write-only register group and an output end of the temperature sensor, a control end of the second multiplexer is connected to an output end of the fifth write-only register, and an output end of the second multiplexer and an output end of the fourth write-only register group are both connected to an input end of the decoding sub-circuit.

3. The circuit for calibration control of claim 1, wherein the mapping circuit comprises an anti-fuse array, and data stored in the anti-fuse array is obtained by programming based on a relationship between a plurality of sets of environmental parameters and a plurality of candidate calibration codes,
  wherein an input end of the anti-fuse array is configured to receive the parameter decoding signals, and an output end of the anti-fuse array is configured to output the first calibration code.

4. The circuit for calibration control of claim 3, wherein the memory further comprises an on-chip calibration circuit, wherein
  the on-chip calibration circuit is configured to receive an enable signal, and perform ZQ self-calibration processing on the memory to obtain a second calibration code adapted to the current set of environmental parameters in a case where the enable signal is in a valid state; and
  the mode switching circuit is further configured to receive the second calibration code, and determine the second calibration code as the ZQ calibration code in a case where the calibration mode signal indicates an on-chip calibration mode.

5. The circuit for calibration control of claim 4, wherein the off-chip calibration circuit is further configured to receive and store a third calibration code sent by a user, wherein at most one of the first calibration code and the third calibration code is valid; and
  the mode switching circuit is further configured to receive the third calibration code, and determine a valid one of the first calibration code and the third calibration code as the ZQ calibration code in the case where the calibration mode signal indicates the off-chip calibration mode.

6. The circuit for calibration control of claim 5, wherein the mode switching circuit comprises a first selection circuit and a second selection circuit, wherein
  the first selection circuit is configured to receive the calibration mode signal, output a selection signal in a first state and the enable signal in an invalid state in the case where the calibration mode signal indicates the off-chip calibration mode, or output the selection signal in a second state and the enable signal in a valid state in the case where the calibration mode signal indicates the on-chip calibration mode; and
  the second selection circuit is configured to receive the selection signal, output the valid one of the first calibration code and the third calibration code as the ZQ calibration code in a case where the selection signal is in the first state, or output the second calibration code as the ZQ calibration code in a case where the selection signal is in the second state.

7. The circuit for calibration control of claim 6, wherein the first selection circuit comprises a first write-only register, the second selection circuit comprises a first multiplexer, and the off-chip calibration circuit further comprises a second write-only register group, wherein
  an input end of the first write-only register is configured to receive the calibration mode signal, and an input end of the second write-only register group is configured to receive the third calibration code;
  an enabling end of the on-chip calibration circuit is connected to a first output end of the first write-only register for receiving the enabling signal; and
  a control end of the first multiplexer is connected to a second output end of the first write-only register for receiving the selection signal, a first input end of the first multiplexer is connected to an output end of the on-chip calibration circuit for receiving the second calibration code, a second input end of the first multiplexer is connected to the output end of the anti-fuse array for receiving the first calibration code, a third input end of the first multiplexer is connected to an output end of the second write-only register group for receiving the third calibration code, and an output end of the first multiplexer is configured to output the ZQ calibration code.

8. The circuit for calibration control of claim 7, wherein the circuit for calibration control further comprises an acquisition circuit, an input end of the acquisition circuit is connected to an output end of the mode switching circuit, wherein
  the on-chip calibration circuit is further configured to perform the ZQ self-calibration processing for a plurality of times on the memory for a plurality of sets of environmental parameters in a first test mode, to obtain a plurality of candidate calibration codes, each of the plurality of candidate calibration codes corresponding to a respective one of the plurality of sets of environmental parameters and a respective execution of the ZQ self-calibration processing;
  the mode switching circuit is further configured to receive the calibration mode signal indicating the on-chip calibration mode in the first test mode, to output the plurality of candidate calibration codes; and the acquisition circuit is configured to acquire the plurality of candidate calibration codes to establish the relationship between the plurality of sets of environmental parameters and the plurality of candidate calibration codes.

9. The circuit for calibration control of claim 8, wherein the acquisition circuit comprises a read-only register group, and an input end of the read-only register group is connected to the output end of the first multiplexer, wherein the read-only register group is configured to acquire an output signal of the first multiplexer; and the read-only register group is further configured to receive a read instruction after the on-chip calibration circuit performs the ZQ self-calibration processing for one time in the first test mode, and output, according to the read instruction, a respective one of the plurality of candidate calibration codes.

10. The circuit for calibration control of claim 1, wherein the memory further comprises an output drive circuit and a termination resistor circuit, wherein the memory is further configured to write the ZQ calibration code into the output drive circuit and the termination resistor circuit, to implement resistance calibration processing for the output drive circuit and the termination resistor circuit.

11. An electronic device comprising a memory, and the memory comprising a circuit for calibration control, wherein the circuit for calibration control comprises: an off-chip calibration circuit and a mode switching circuit, the off-chip calibration circuit comprising a preprocessing circuit and a mapping circuit, wherein the preprocessing circuit is configured to receive a current set of environmental parameters, decode the current set of environmental parameters and output parameter decoding signals;

the mapping circuit is configured to receive the parameter decoding signals and output a first calibration code according to the parameter decoding signals; and the mode switching circuit is configured to receive a calibration mode signal and the first calibration code, and determine the first calibration code as a ZQ calibration code in a case where the calibration mode signal indicates an off-chip calibration mode;

wherein the current set of environmental parameters comprises a current temperature parameter and a current voltage parameter, the parameter decoding signals comprise a temperature decoding signal and a voltage decoding signal, and the preprocessing circuit comprises a temperature sub-circuit, a voltage sub-circuit and a decoding sub-circuit, wherein the temperature sub-circuit is configured to determine the current temperature parameter;

the voltage sub-circuit is configured to determine the current voltage parameter; and the decoding sub-circuit is configured to receive the current voltage parameter and the current temperature parameter, and decode the current temperature parameter and the current voltage parameter to obtain the temperature decoding signal and the voltage decoding signal;

wherein the current temperature parameter and the current voltage parameter are both sent by a user, the temperature sub-circuit comprises a third write-only register group, and the voltage sub-circuit comprises a fourth write-only register group, wherein an input end of the third write-only register group is configured to receive the current temperature parameter sent by the user, an input end of the fourth write-only register group is configured to receive the current voltage parameter sent by the user, and an output end of the third write-only register group and an output end of the fourth write-only register group are both connected to an input end of the decoding sub-circuit.

* * * * *